(12) United States Patent
Yamana

(10) Patent No.: US 6,342,334 B1
(45) Date of Patent: Jan. 29, 2002

(54) CHEMICALLY AMPLIFIED RESIST COMPOSITIONS

(75) Inventor: Mitsuharu Yamana, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/573,009

(22) Filed: May 18, 2000

(30) Foreign Application Priority Data

May 20, 1999 (JP) ............................................ 11-140249

(51) Int. Cl.$^7$ ................................................ G03F 7/004
(52) U.S. Cl. .................... 430/270.1; 430/920; 430/921; 430/923
(58) Field of Search .............................. 430/270.1, 921, 430/923, 920, 919

(56) References Cited

U.S. PATENT DOCUMENTS 5,308,744 A    5/1994   Koes ........................... 430/326

FOREIGN PATENT DOCUMENTS

| JP | 8-253534 | 10/1996 |
| JP | 9-120158 | 5/1997 |
| JP | 9-221519 | 8/1997 |
| JP | 10-97060 | 4/1998 |
| JP | 10-133378 | 5/1998 |
| JP | 10-265524 | 10/1998 |
| JP | 11-02901 | 1/1999 |
| JP | 11-07124 | 1/1999 |
| JP | 11-109631 | 4/1999 |
| JP | 11-344808 | 12/1999 |
| JP | 2000-66400 | 3/2000 |

*Primary Examiner*—Rosemary Ashton
(74) *Attorney, Agent, or Firm*—McGinn & Gibb, PLLC

(57) ABSTRACT

Provided is a chemically amplified resist composition comprising a photoacid generator which releases, by exposure to light, an acid containing both a sulfonic acid group and a carboxyl group; and an acid sensitive resin which contains a dissolution controlling group to be cleaved therefrom by the action of the acid, thereby forming a carboxy-containing alkali soluble resin; or a chemically amplified resist composition comprising a photoacid generator and an acid sensitive resin which has a huge molecular weight and from which the dissolution controlling group is cleaved owing to the decomposition of the partially crosslinked structure by the acid released from the photoacid generator. By the above-described composition, ultrafine processing can be carried out with improved focal depth, whereby an excellent rectangular pattern can be formed.

20 Claims, 2 Drawing Sheets

CHEMICALLY AMPLIFIED RESIST COMPOSITIONS

BACKGROUND OF THE INVENTION

1. Field of the Invention

This invention relates to a chemically amplified resist composition and more specifically, to a chemically amplified resist composition improved in the depth of focus.

2. Description of the Prior Art

In the fields of the fabrication of various devices typified by a semiconductor device, which require fine processing on the order of submicrons, there is an increasing demand for actualizing higher densification and higher integration. Under such situations, the requirements for photolithography have become severer.

In recent days, a chemically amplified resist attracts attentions in such fields. This chemically amplified resist makes use of the catalytic action of an acid formed by exposure to light. It is characterized in that since the generation efficiency of an acid is high even under the conditions providing only small exposure energy, it has high sensitivity and high resolution.

The resist is composed principally of a photoacid generator which releases an acid and an acid sensitive resin which undergoes a marked change in the solubility in an aqueous alkaline solution, which is a developer, owing to the generation of the acid.

As an example of the prior art, a chemically amplified resist composition comprising, as an photoacid generator, N-(p-toluenesulfonyloxy)-5-norbornene-2,3-dicarboxyimide and, as an acid sensitive resin, a (hydroxystyrene)-(tert-butylcarboxystyrene) copolymer can be mentioned.

When the above-described resist is exposed to light, first-stage reaction occurs in accordance with the below-described reaction scheme (6), whereby N-(p-toluenesulfonyloxy)-5-norbornene-2,3-dicarboxyimide used as a photoacid generator is decomposed and p-toluenesulfonic acid (p-toluenesulfonic acid ion) which is an acid component, is released.

(6)

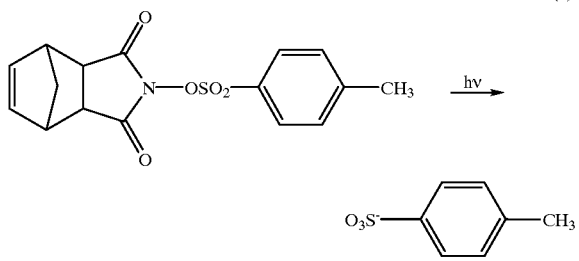

Then, in the second-stage reaction, the acid thus released acts on the acid sensitive resin, that is, a (hydroxystyrene)-(tert-butylcarboxystyrene) copolymer, whereby the acid sensitive resin is converted into an alkali-soluble (hydroxystyrene)-(tert-carboxystyrene) copolymer in accordance with the below-described reaction scheme (7). This alkali-soluble resin is dissolved in an alkali developer, whereby development is effected.

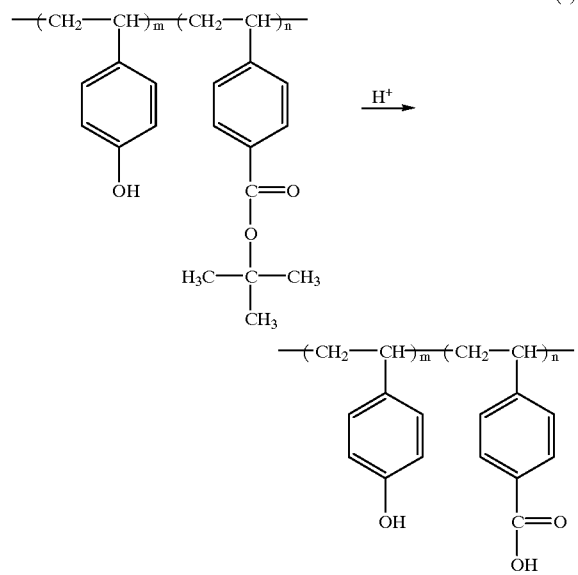

(7)

The alkali development is allowed to proceed through the reaction procedures as described above. Owing to a high generation efficiency of an acid in exposed regions, a pattern of high resolution is available.

Owing to the recent tendency to higher densification and higher integration, it has come to be impossible to sufficiently satisfy the request for ultra-fine processing of a device even by using such a resist.

For example, when the above-described resist was applied to a silicon substrate, followed by exposure to light and development by a KrF stepper under the optical conditions of NA of 0.60 and σ of 0.75 to form a contact hole pattern of 0.20 µm, the depth of focus thus obtained was only 0.60 µm. It was therefore difficult to form a contact hole having a sufficient rectangularity.

On the surface of a wafer, there exists unevenness due to inner circuits. When a resist is applied onto such unevenness, this unevenness is reproduced to some extent on the surface of the resist. In this case, best focus is not always available all over the wafer. The depth of focus, which is a focus margin, must be sufficiently deep for ultra-fine processing even in such a case.

In FIG. 2, an inner circuit 22, an intrastratum insulating film 23 and a resist layer 24 are formed over a substrate 21. This drawing illustrates how the resist layer 24 is exposed to light for the formation of a contact hole in the intrastratum insulating film 23, on the supposition that a substrate wafer is exposed to light at three places by moving the stage having the substrate wafer placed thereon.

The resist layer 24 reproduces, on its surface, unevenness of the inner circuits. In this case, a distance between the light source for exposure and the resist layer is not always constant on the whole surface of the wafer. Moreover, the light intensity upon exposure has a predetermined distribution. For example, in spite of the best focus at the site (2), the sites (1) and (3) are under the state of defocus and the intensity of the light incident on the resist inevitably becomes weak. When a conventional resist is employed, exposure is insufficient at the site of weak light intensity, leading to a marked reduction in resolution.

A description was so far made of the lowering in the resolution due to shortage in the light intensity upon exposure. In addition, a film decrease upon alkali development becomes one factor for disturbing ultrafine processing.

FIG. 3 is a schematic view illustrating the etching of the intrastratum insulating film 32 with a resist pattern formed over the intrastratum insulating film 32 laid over the substrate 31. In FIGS. 3(b-1) to 3(b-3), an ordinarily employed resist 33b is used. As is apparent from FIG. 3(b-2), a developer causes a film decrease of the resist 33b, which prevents the formation of a good rectangular pattern. When the intrastratum insulating film is etched using this pattern, the narrowing of the intrastratum insulating film occurs. This pattern is therefore not suited for ultrafine processing.

SUMMARY OF THE INVENTION

An object of the present invention is therefore to provide a chemically amplified resist composition which permits ultrafine processing improved in the depth of focus and is excellent in the pattern rectangularity, in consideration of the above-described problems.

In a first aspect of the present invention, there is thus provided a chemically amplified resist composition comprising an photoacid generator which releases an acid by exposure to light and an acid sensitive resin which has an alkali soluble group protected with a dissolution controlling group and is converted into an alkali soluble resin by the cleavage of the dissolution controlling group caused by the action of the acid, wherein the acid contains a sulfonic acid group and a carboxyl group and the alkali soluble resin contains a carboxyl group.

In the above-described chemically amplified resist composition, the photoacid generator is preferably a compound represented by the following formula (1):

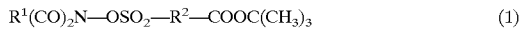

$$R^1(CO)_2N\text{—}OSO_2\text{—}R^2\text{—}COOC(CH_3)_3 \quad (1)$$

wherein $R^1$ represents a dicarboxyimide compound residue and $R^2$ represents a cyclohexylene or phenylene group.

In the above-described chemically amplified resist composition, the acid sensitive resin is preferably represented by the below-described formula (2) or (3) and has a weight-average molecular weight of 3,000 to 30,000:

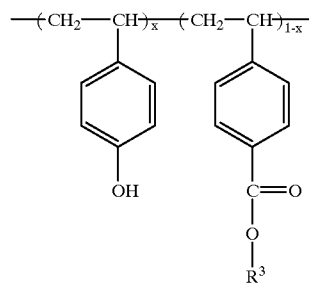

(2)

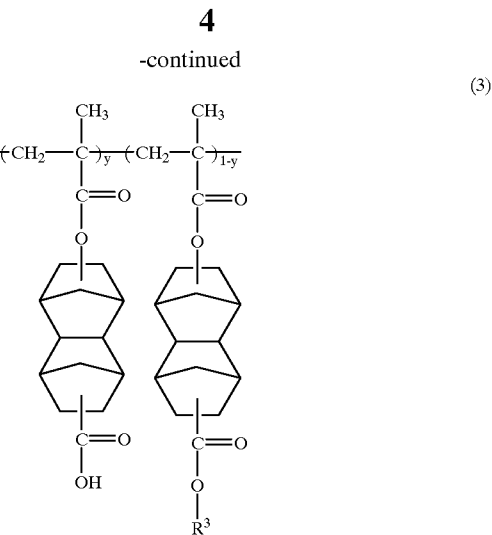

(3)

wherein $R^3$ represents a tert-butyl group, tetrahydropyranyl group or $R^4(R^5O)CH$— in which $R^4$ and $R^5$ each independently represents a $C_{1\text{-}4}$ alkyl group, x stands for 0.4 to 0.9 and y stands for 0.1 to 0.9.

In the above-described chemically amplified resist composition, the photoacid generator is incorporated in an amount of 1 to 15 wt. % relative to the acid sensitive resin.

In a second aspect of the present invention, there is also provided a chemically amplified resist composition comprising an photoacid generator which releases an acid by exposure to light, and an acid sensitive resin which has an alkali soluble group protected with a dissolution controlling group and is converted into an alkali soluble resin by the cleavage of the dissolution controlling group caused by the action of the acid, wherein the acid sensitive resin is represented by the below-described formula (4) or (5) and has a weight-average molecular weight of 100,000 to 5,000,000:

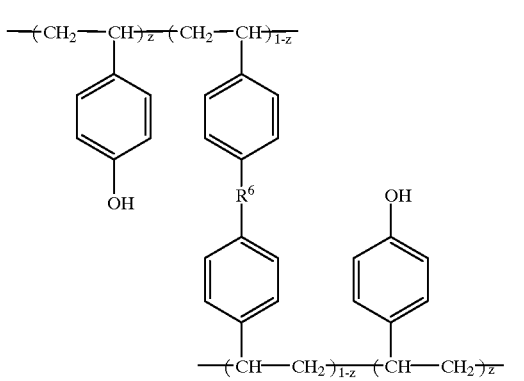

(4)

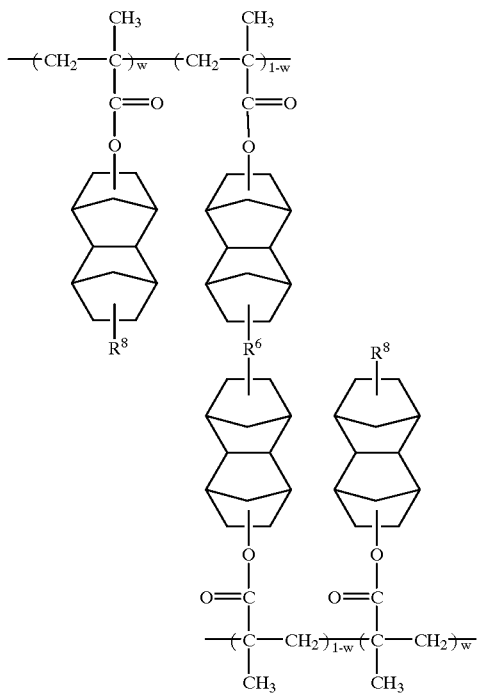

(5)

wherein $R^6$ represents a crosslinked structure of —O—C$(CH_3)_2$—O— or —CO—O—C$(CH_3)_2$—O—CO—, $R^8$ represents a hydroxyl group or a carboxyl group, z stands for 0.1 to 0.9 and w stands for 0.1 to 0.9.

In the chemically amplified resist composition, when the crosslinked structure $R^6$ of the acid sensitive resin is —CO—O—C$(CH_3)_2$—O—CO—, the photoacid generator is preferably a compound represented by the following formula (1):

$$R^1(CO)_2N\text{—}OSO_2\text{—}R^2\text{—}COOC(CH_3)_3 \qquad (1)$$

wherein $R^1$ represents a dicarboxyimide compound residue and $R^2$ represents a cyclohexylene or phenylene group.

In the chemically amplified resist composition, the photoacid generator is incorporated in an amount of 1 to 15 wt. % relative to the acid sensitive resin.

The chemically amplified resist composition according to the first aspect of the present invention comprising a photoacid generator which releases, by exposure to light, an acid containing both a sulfonic acid group and a carboxyl group; and an acid sensitive resin which undergoes cleavage of a dissolution controlling group by the action of the acid to form an alkali soluble resin containing a carboxyl group has a remarkably improved maximum dissolution rate and also improved focus depth by the association of the sulfonic-acid-containing acid with the alkali soluble resin in an alkali developer.

The chemically amplified resist composition according to the second aspect of the present invention comprises a photoacid generator and an acid sensitive resin which has a huge molecular weight and from which the dissolution controlling group is cleaved by the decomposition of the partial crosslinked structure due to the acid released from the photoacid generator. This chemically amplified resist has a sufficient molecular weight at unexposed regions, which makes it possible to lower the minimum dissolution rate and to form a good rectangular pattern, thereby improving the depth of focus.

Moreover, by using, in combination, the photoacid generator which releases an acid containing both a sulfonic acid group and a carboxyl group by exposure to light, and an acid sensitive resin which forms a carboxyl-containing alkali soluble resin by the decomposition of its partial crosslinked structure caused by the acid, it is possible to simultaneously accomplish an increase of the maximum dissolution rate and decrease of the minimum dissolution rate, whereby the excellent focal depth is available.

Use of such a chemically amplified resist composition having a deep focal depth makes it possible to conduct ultrafine processing such as formation of a contact hole of 0.20 μm or less or formation of a circuit having a line spacing or line width of 0.15 μm.

DETAILED DESCRIPTION OF PREFERRED EMBODIMENTS

Figure 1:
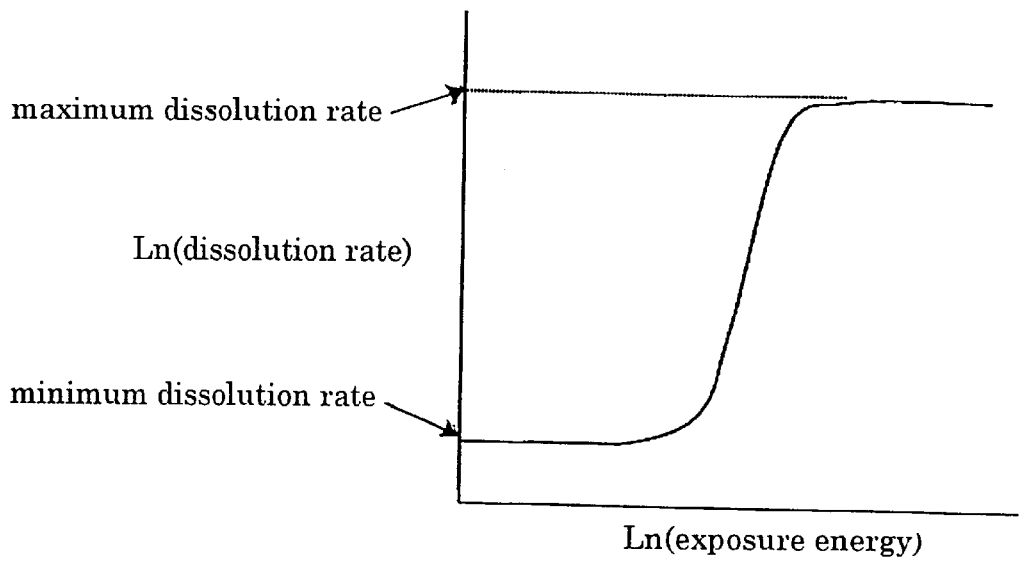
FIG. 1 is a log-log graph illustrating the relationship between the exposure energy of a resist and dissolution rate.

The present inventors paid particular attentions to the solubility of a resist in an alkali. FIG. 1 is a log-log graph illustrating the relationship between the exposure energy of the resist and dissolution rate. As illustrated in this drawing, at smaller exposure energy, the dissolution rate is low and shows the minimum fixed value (minimum dissolution rate), indicating difficulty in development at the site where exposure is blocked by a mask or the like. The dissolution rate starts a drastic increase at the exposure energy increased to a certain value. By a further increase in the exposure energy, the dissolution rate shows the maximum fixed value (maximum dissolution rate). This maximum dissolution rate indicates easiness of development at the mask opening site.

When the exposure properties of a resist as shown in FIG. 1 are taken into consideration, there are two methods to attain an improvement in the focal depth, which is an object of the present invention. The first one is to raise the maximum dissolution rate while substantially maintaining the minimum dissolution rate.

Figure 2:
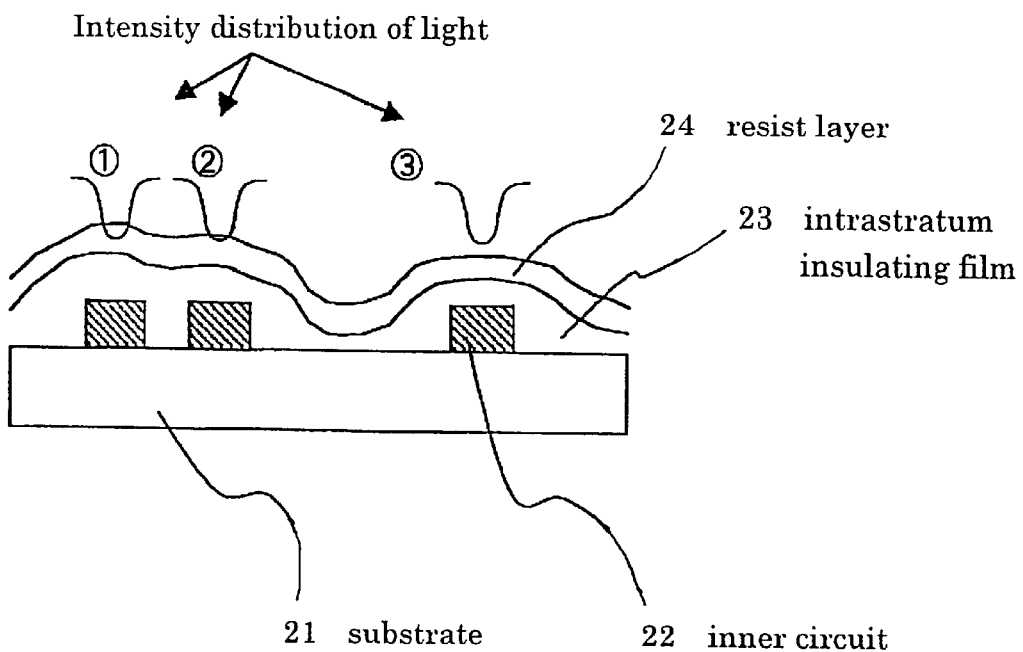
FIG. 2 illustrates how the resist having unevenness on its surface is exposed to light, wherein indicated at numeral 21 is a substrate, 22 an inner circuit, 23 an intrastratum insulating film and 24 a resist layer.

Described specifically, an improvement in the maximum dissolution rate enables a sufficient dissolution rate even at a site where the intensity of light is low, which makes it possible to attain sufficient resolution at a defocus site, such as the site (1) or (3) in FIG. 2, where the intensity of an incident light on the resist is weak.

The second method is to lower the minimum dissolution rate while substantially maintaining the maximum dissolution rate. Described specifically, in this method, a film decrease in an alkali developer is suppressed by controlling the solubility of the unexposed site of the resist in an alkali developer.

Figure 3:
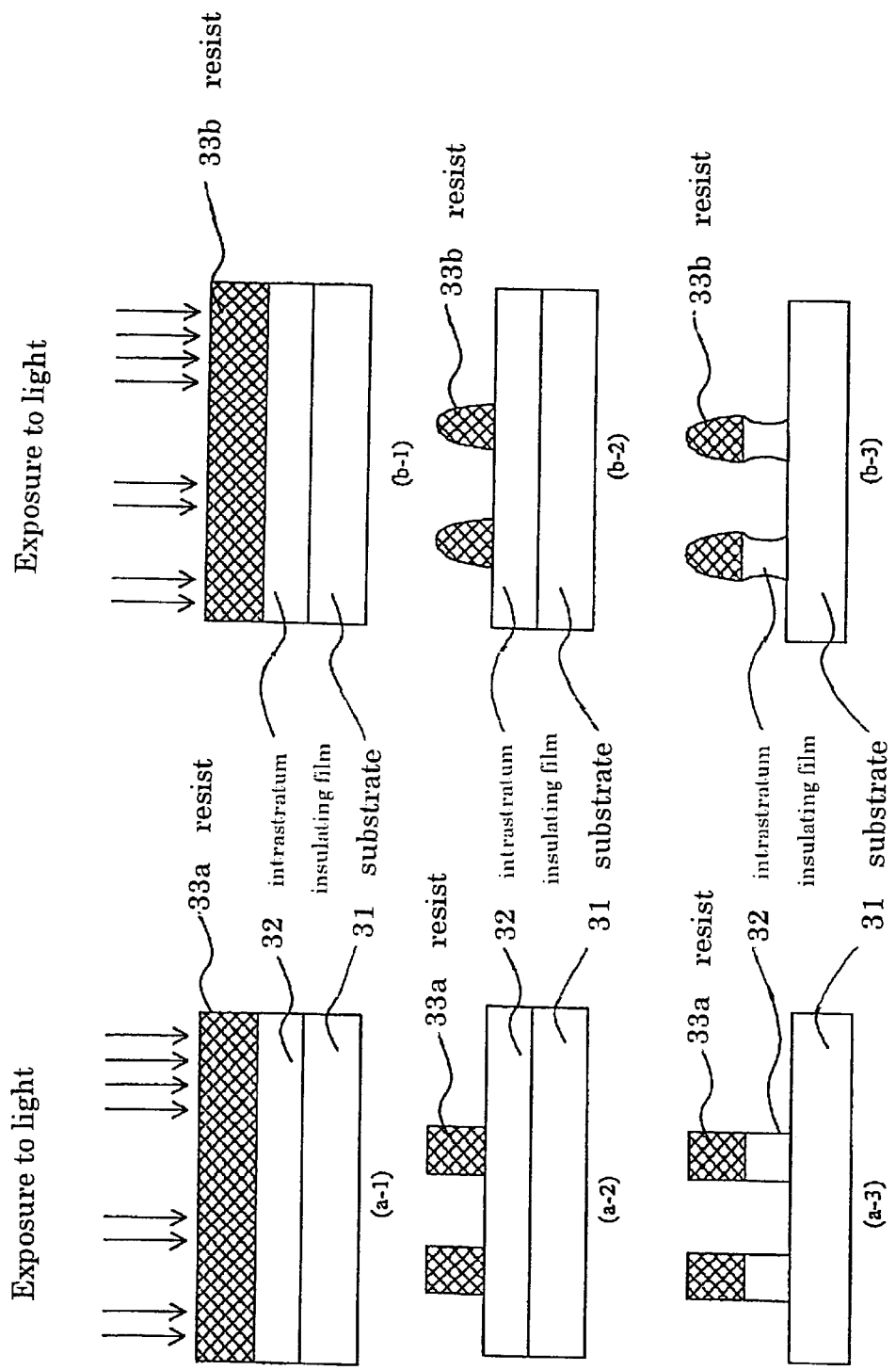
FIG. 3 is a schematic view for describing the rectangularity by comparing resist patterns formed using resists different in the maximum dissolution rate, wherein indicated at numeral 31 is a substrate, 32 an intrastratum insulating film, 33a a resist layer having a small minimum dissolution rate and 33b a resist layer (conventional resist) having an ordinary minimum dissolution rate.

FIGS. 3(a-1) to (a-3) are schematic views illustrating how the intrastratum insulating film 32 is etched when the resist 33a having a small minimum dissolution rate is employed.

Since the minimum dissolution rate of the resist is suppressed to a lower level, a film decrease does not occur easily at an unexposed portion of a resist pattern as shown in FIG. 3(a-1), which is different from that shown in FIG. 3(b-1). Thus, a good rectangular pattern with excellent focal density is formed. Favorable patterning free from narrowing can be conducted by etching of the intrastratum insulating film through the resulting pattern.

As described above, an improvement in the focal depth of a resist, which is an object of the present invention, can be attained and sufficient resolution is available even in ultra fine processing, by raising the maximum dissolution rate of the resist, lowering its minimum dissolution rate, or adopting both measures. The maximum dissolution rate or minimum dissolution rate to be raised or lowered varies depending on the kind of a light source employed.

First, a description will next be made of the composition of a resist for attaining the first method. A chemically amplified resist composition is formed of, as essential ingredients, a photoacid generator which releases an acid by exposure to light and an acid sensitive resin which is converted to an alkali soluble resin by the acid thus released.

The photoacid generator employed in the first method of the present invention must release an acid containing therein both a sulfonic acid group and a carboxyl group when exposed to light. Any photoacid generator can be used in the present invention insofar as it satisfies the above-described condition and releases an acid with sufficiently high efficiency by exposure to light.

Examples of such a compound include compounds each represented by the following formula (1):

$$R^1(CO)_2N-OSO_2-R^2-COOC(CH_3)_3 \qquad (1)$$

wherein $R^1$ represents a dicarboxyimide compound residue and $R^2$ represents a cyclohexylene or phenylene group.

Specific examples include N-(p-tert-butylcarboxybenzenesulfonyloxy)-5-norbornene-2,3-dicarboxyimide, N-(p-tert-butylcarboxybenzenesulfonyloxy)-phthalimide, N-(p-tert-butylcarboxybenzenesulfonyloxy)-naphthalimide, N-(p-tert-butylcarboxycyclohexylsulfonyloxy)-5-norbornene-2,3-dicarboxyimide, N-(p-tert-butylcarboxycyclohexylsulfonyloxy)-phthalimide and N-(p-tert-butylcarboxycyclohexylsulfonyloxy)-naphthalimide. The chemical formulas of the above-exemplified compounds are shown in Table 1.

TABLE 1

| Chemical formula | Name |
|---|---|
|  | N-(p-tert-butylcarboxy-benzenesulfonyloxy)-5-norbornene-2,3-dicarboxy-imide |
|  | N-(p-tert-butylcarboxy-benzenesulfonyloxy)-phthalimide |
|  | N-(p-tert-butylcarboxy-benzenesulfonyloxy)-naphthalimide |
|  | N-(p-tert-butylcarboxy-cyclohexylsulfonyloxy)-5-norbornene-2,3-dicarboxy-imide |

TABLE 1-continued

| Chemical formula | Name |
| --- | --- |
| 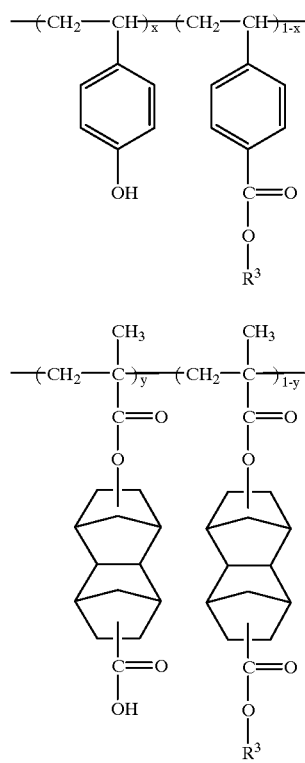 | N-(p-tert-butylcarboxy-cyclohexylsulfonyloxy)-phthalimide |
| | N-(p-tert-butylcarboxy-cyclohexylsulfonyloxy)-naphthalimide |

As the acid sensitive resin, usable is a resin which contains an alkali soluble group protected with a dissolution controlling group and is converted into a carboxyl-containing alkali soluble resin by cleavage of the dissolution controlling group owing to the action of the acid released from the photoacid generator.

Examples of such an acid sensitive resin include resins each having a weight-average molecular weight of 3,000 to 30,000 and represented by the below-described formula (2) or (3):

$$-(CH_2-CH)_x-(CH_2-CH)_{1-x}- \quad (2)$$

(with pendant phenyl-OH and phenyl-C(=O)-O-R$^3$ groups)

$$-(CH_2-C(CH_3))_y-(CH_2-C(CH_3))_{1-y}- \quad (3)$$

(with pendant C(=O)-O-adamantyl-C(=O)-OH and C(=O)-O-adamantyl-C(=O)-O-R$^3$ groups)

wherein, R$^3$ represents a tert-butyl group, a tetrahydropyranyl group or R$^4$(R$^5$O)CH— in which R$^4$ and R$^5$ each independently represents a $C_{1-4}$ alkyl group, x stands for 0.4 to 0.9, preferably 0.5 to 0.75, more preferably 0.55 to 0.65 and y stands for 0.1 to 0.9.

Use of such a photoacid generator and an acid sensitive resin in combination brings about a marked improvement in the maximum dissolution rate of an exposed portion in an alkali developer, because the carboxyl group of the acid released from the photoacid generator associates, in an alkali developer, with the carboxyl group of the alkali soluble resin formed by the cleavage of the dissolution controlling group from the acid sensitive resin. As a result, the alkali soluble resin acquires a sulfonic acid group, thereby having notably improved affinity with the alkali developer.

For example, when N-(p-tert-butylcarboxybenzenesulfonyloxy)-5-norbornene-2,3-dicarboxyimide and (hydroxystyrene)$_m$-(p-tert-butylcarboxystyrene)$_n$ corresponding to a KrF light source are used as a photoacid generator and an acid sensitive resin, respectively, the photoacid generator is converted, by exposure to light, into p-tert-carboxybenzenesulfonic acid (p-tert-carboxybenzenesulfonic acid ion) in accordance with the reaction scheme (8).

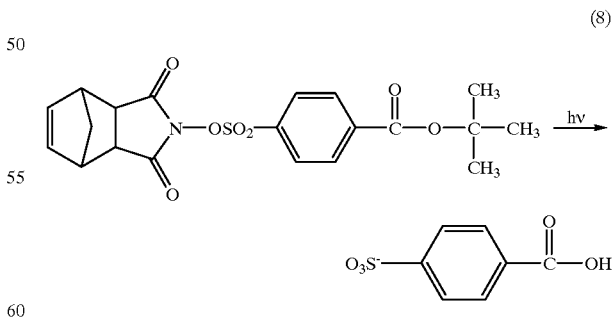

(8)

The resulting acid causes a reaction to remove the dissolution controlling group (tert-butyl group) from the acid sensitive resin in accordance with the reaction scheme (7), whereby an alkali soluble resin (hydroxystyrene)$_m$-(p-carboxystyrene)$_n$ is formed.

(7)

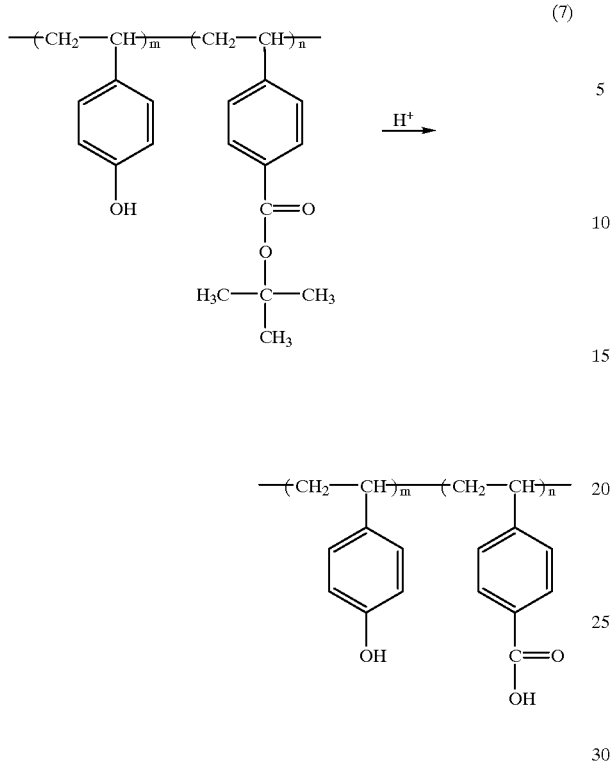

Since this (hydroxystyrene)$_m$-(p-carboxystyrene)$_n$ contains a carboxyl group, it smoothly associates with p-tert-carboxybenzenesulfonic acid in an alkali developer as shown in the formula (9).

(9)

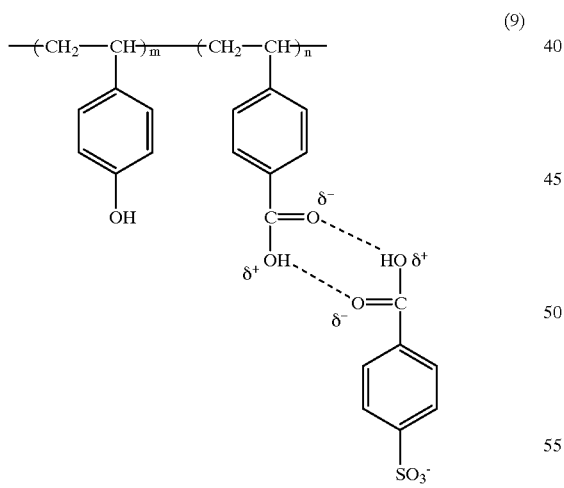

As a result, owing to the action of a sulfonic acid group, the affinity of the alkali soluble resin with the alkali developer shows a remarkable improvement, leading to a rise in its maximum dissolution rate.

Also in the case where (carboxytetracyclododecyl methacrylate)$_m$-(tert-butylcarboxytetracyclododecyl methacrylate)$_n$ is used, for example, as the resin corresponding to an ArF light source, it associates with p-tert-carboxybenzenesulfonic acid in an alkali developer as shown in the reaction scheme (10), which heightens the maximum dissolution rate.

(10)

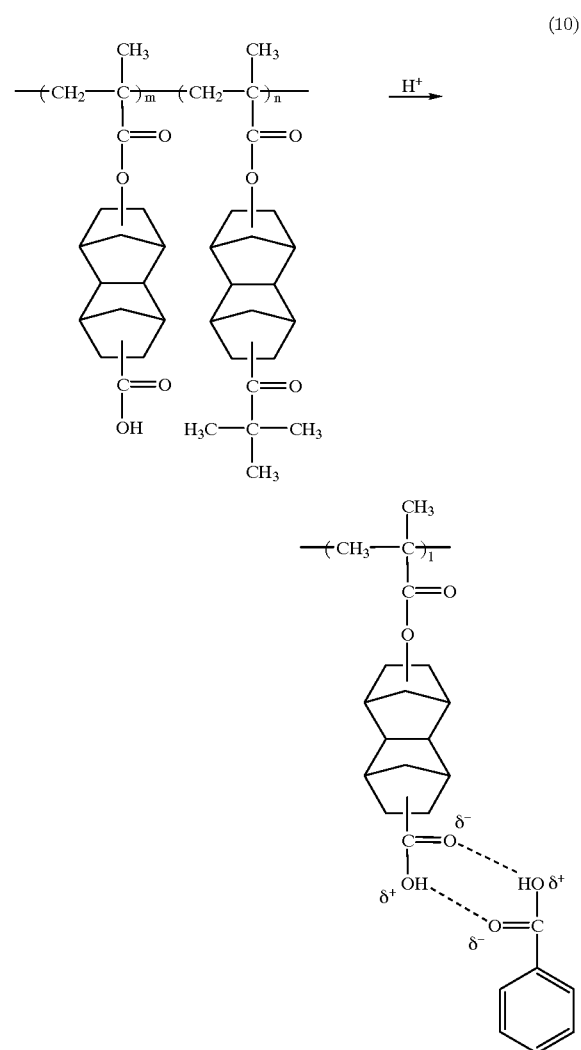

A description will next be made of the composition of the resist for attaining the second method of the present invention. Similar to the resist used in the first method, the chemically amplified resist composition in this second method comprises, as essential ingredients, a photoacid generator which releases an acid by exposure to light and an acid sensitive resin which is converted into an alkali soluble resin by the acid thus released.

In this method, the acid sensitive resin has, in the molecule thereof, a partial crosslinked structure for lowering the minimum dissolution rate.

More specifically, the acid sensitive resin has a weight-average molecular weight of 100,000 to 5,000,000 and is represented by the below-described formula (4) or (5):

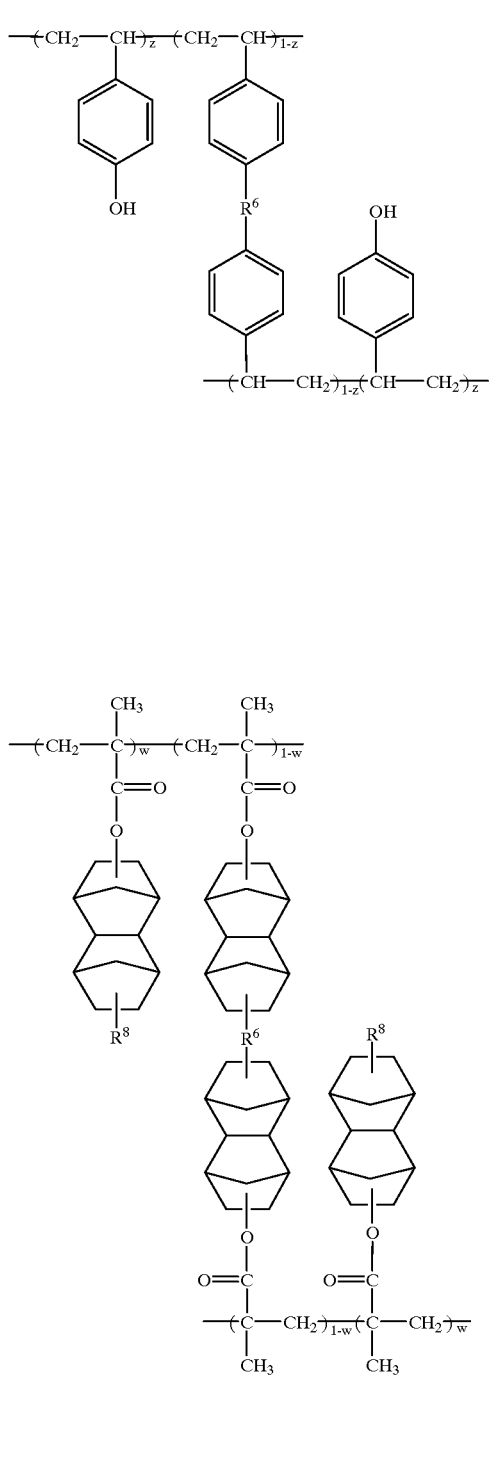

(4)

(5)

wherein, $R^6$ represents —O—C(CH$_3$)$_2$—O— or —CO—O—C(CH$_3$)$_2$—O—CO—, $R^8$ represents a hydroxyl or carboxyl group, z stands for 0.1 to 0.9 and w stands for 0.1 to 0.9. This resin will hereinafter be called crosslink-structured resin.

Next, the reaction mechanism upon exposure will be described using, as an example, an acid sensitive resin which is a resin corresponding to a Krf light source and has a hydroxystyrene skeleton and has, as a crosslinked structure, an isopropylideneoxy group (—O—C(CH$_3$)$_2$—O—). The isopropylidene group, which is a dissolution controlling group, is cleaved by the acid as shown in the reaction scheme (11), whereby the acid sensitive resin is converted into an alkali soluble resin.

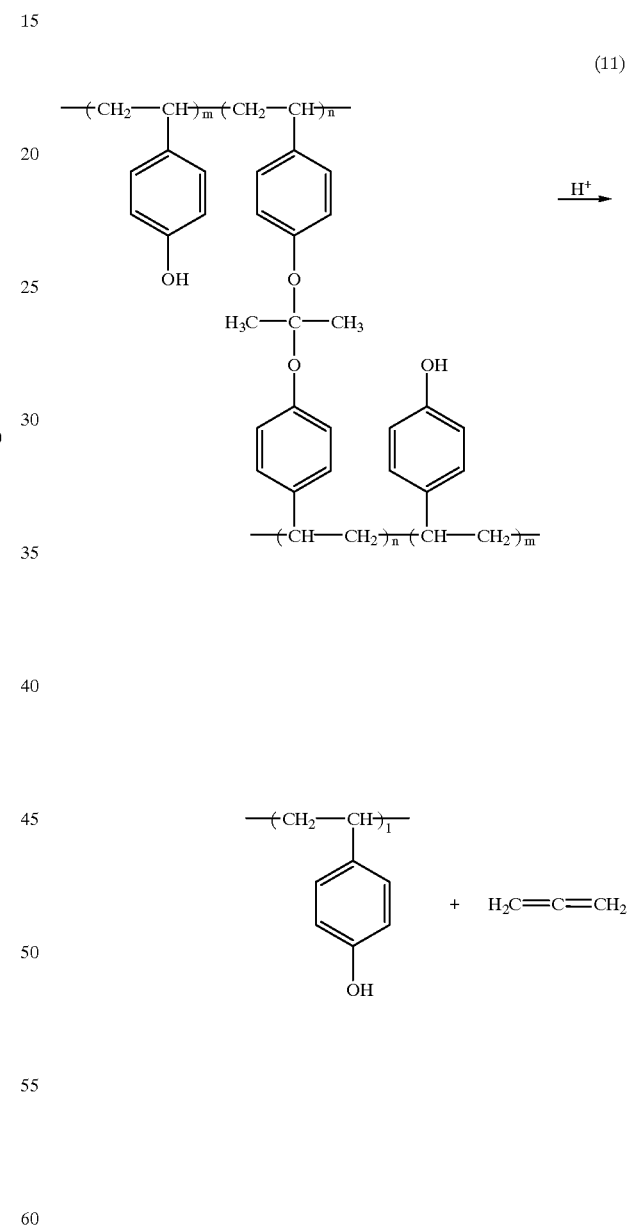

(11)

When a resin having a carboxytetracyclododecyl methacrylate skeleton is used as a resin corresponding to an ArF light source, an alkali soluble resin is formed, as shown in the reaction scheme (12), by the reaction mechanism similar to that shown in the reaction scheme (11).

(12)

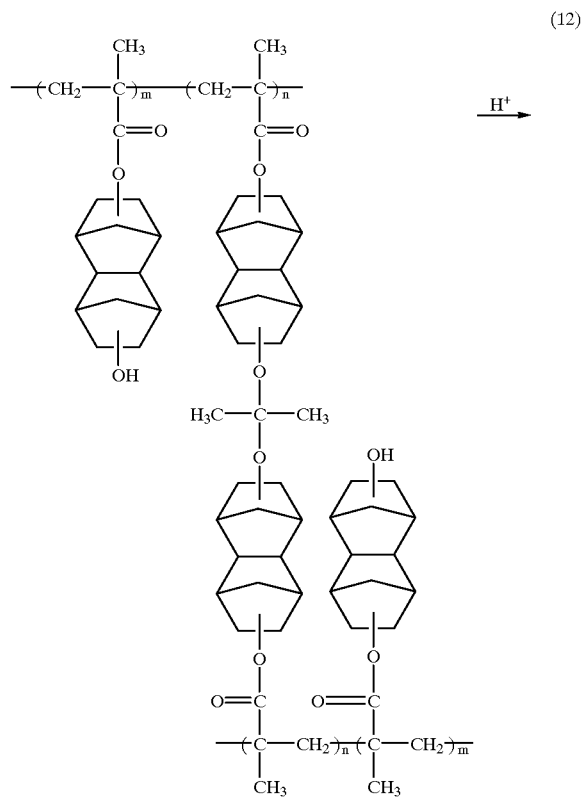

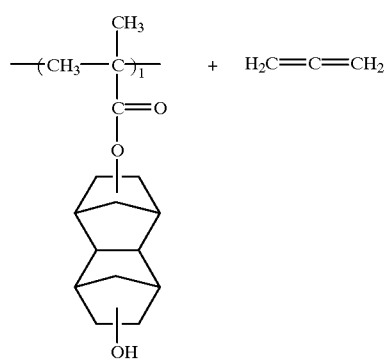

In either case, the acid sensitive resin having a weight-average molecular weight of 100,000 to 5,000,000 is sparingly soluble in an alkali developer at an unexposed portion, which makes it possible to sufficiently lower the minimum dissolution rate. On the other hand, the crosslinked portion forming a giant molecule is cleaved by exposure to light, which largely lowers the molecular weight during the process to form an alkali soluble resin, while maintaining the maximum dissolution rate at a similar level to that of the conventional resist composition. When the crosslinked structure $R^6$ represents —CO—O—C(CH$_3$)$_2$—O—CO— in the formula (4) or (5) of the acid sensitive resin, it is preferred to use the photoacid generator of the first method and releases an acid containing both a sulfonic acid group and a carboxyl group by exposure to light, because when the crosslinked structure CO—O—C(CH$_3$)$_2$—O—CO— is cleaved by the action of an acid as shown in the reaction scheme (13), the alkali soluble resin thus formed contains a carboxyl group.

Such a resist composition is effective both for lowering the minimum dissolution rate and raising the maximum dissolution rate.

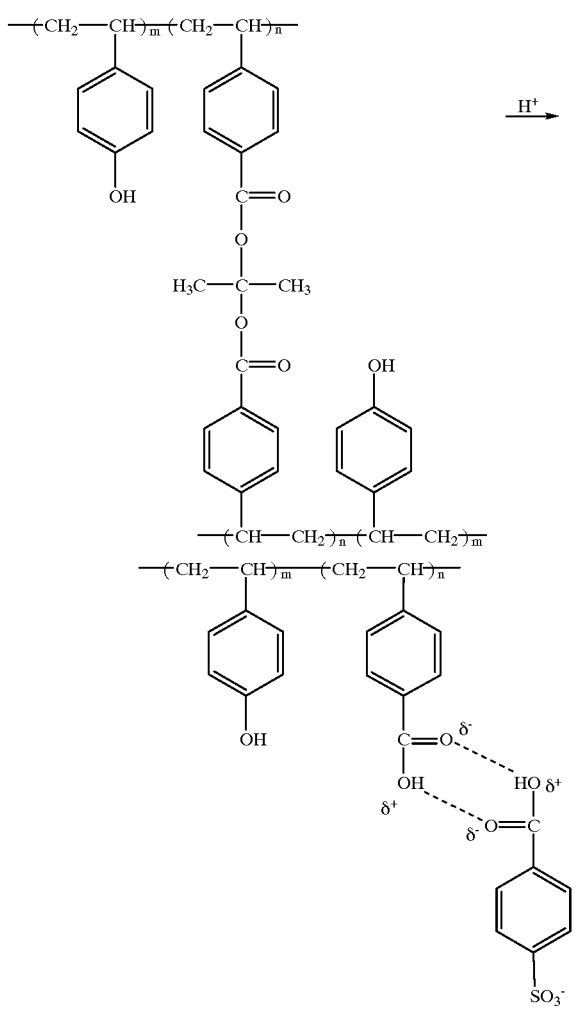

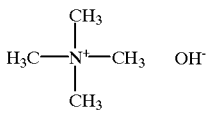

In the chemically amplified resist composition according to the present invention, the photoacid generator is incorporated in an amount of 1 to 15 wt. %, preferably 5 to 10 wt. % relative to the acid sensitive resin.

In the chemically amplified resist composition according to the present invention, a solvent is used in order to dissolve therein the photoacid generator and acid sensitive resin. As preferred solvents, PGMEA (propylene glycol monomethyl ether acetate) and EL (ethyl lactate) can be used. For example, PGMEA is used singly for a resin corresponding to a KrF light source, while a 1:1 mixed solvent of PGMEA and EL is used for a resin corresponding to an ArF light source.

The acid sensitive resin is preferably incorporated in an amount of about 11 to 21 wt. % based on the whole resist solution and the solvent is preferably added in an amount of about 79 to 89 wt. % based on the whole resist solution.

It is possible to add, to the chemically amplified resist of the present invention, known additives such as tackifier, leveling agent and anti-foaming agent within an extent not damaging the characteristics of the present invention.

As a preferred example of the alkali developer usable for the chemically amplified resist composition of the present invention, an aqueous solution containing TMAH (tetramethoxyammonium hydroxide) represented by the formula (14) can be mentioned. For example, a 2.38% TMAH aqueous solution can be used for the development of a resin corresponding to an KrF light source, while a 0.12% TMAH aqueous solution can be used for the development of a resin corresponding to an ArF light source.

(14)

$$H_3C-\underset{\underset{CH_3}{|}}{\overset{\overset{CH_3}{|}}{N^+}}-CH_3 \quad OH^-$$

EXAMPLES

Example 1

As an acid sensitive resin, a resin represented by the formula (2) wherein $R^3$ represents a tert-butyl group and x stands for 0.57 and having a weight-average molecular weight of 15,000 was employed.

A resist composition comprising 16 wt. % of the acid sensitive resin, 1.6 wt. % (10 wt. % of the acid sensitive resin) of N-(p-tert-butylcarboxybenzenesulfonyloxy)-5-norbornene-2,3-dicarboxyimide as a photoacid generator and 82.4 wt. % of PGMEA as a solvent was applied to a silicon substrate to form a film having a thickness of 0.70 μm. The resulting film was then exposed to light by a KrF stepper under the optical conditions of NA of 0.60 and σ of 0.75, whereby a contact hole pattern of 0.20 μm was formed. As an alkali developer, a 2.38% TMAH aqueous solution was employed.

Based on the cross-sectional observation of the pattern formed after development, the depth of focus was evaluated.

Upon alkali development, the maximum dissolution rate and the minimum dissolution rate were evaluated at varied exposure energies by using a resist dissolution rate measuring apparatus manufactured by Perkin-Elmer Corporation.

As a result, it was found that the composition had excellent focal depth of 1.00 μm, a maximum dissolution rate as high as 1.0 μm/s, and a minimum dissolution rate of $10^{-5}$ μm/s which was substantially the same as that of the ordinarily-employed resist composition corresponding to an KrF light source.

Comparative Example 1

A resist composition comprising 16 wt. % of the acid sensitive resin employed in Example 1, 1.6 wt. % (10 wt. % of the acid sensitive resin) of N-(p-toluenesulfonyloxy)-5-norbornene-2,3-dicarboxyimide as a photoacid generator and 82.4 wt. % of PGMEA as a solvent was applied to a silicon substrate to form a film having a thickness of 0.70 μm. The resulting film was then exposed to light by a KrF stepper under the optical conditions of NA of 0.60 and σ of 0.75, whereby a contact hole pattern of 0.20 μm was formed. As an alkali developer, a 2.38% TMAH aqueous solution was employed.

As a result of the evaluation under the utterly same conditions as those in Example 1, the composition was found to have a focal depth as shallow as 0.60 μm, a maximum dissolution rate of 0.3 µm/s, and a minimum dissolution rate of $10^{-5}$ µm/s.

Example 2

As an acid sensitive resin, employed was a crosslink-structured resin represented by the formula (4) wherein $R^6$ represents —O—C(CH$_3$)$_2$—O— and z stands for 0.5 and having a weight-average molecular weight of 3,000,000.

A resist composition comprising 17 wt. % of the acid sensitive resin, 1.7 wt. % (10 wt. % of the acid sensitive resin) of N-(p-tert-butylcarboxybenzenesulfonyloxy)-5-norbornene-2,3-dicarboxyimide as a photoacid generator and 81.3 wt. % of PGMEA as a solvent was applied to a silicon substrate to form a film having a thickness of 0.50 µm. The resulting film was then exposed to light by a KrF stepper under the optical conditions of NA of 0.60 and a of 0.75, whereby a stripe pattern having a line spacing and line width, each 0.18 µm was formed. As an alkali developer, a 2.38% TMAH aqueous solution was employed.

As a result of the evaluation under the utterly same conditions as those of Example 1, it was found that the composition had excellent focal depth of 0.80 µm and a maximum dissolution rate as high as 1.0 µm/s. It was also found that the composition had a minimum dissolution rate of $10^{-6}$ µm/s, which was smaller than that of the ordinarily-employed resist corresponding to a KrF light source. The rectangularity of the pattern was excellent.

Comparative Example 2

In a similar manner to Example 2, film formation, pattern formation and evaluation were carried out using the resist composition employed in Comparative Example 1.

As a result, the composition was found to have a focal depth as shallow as 0.50 µm, a maximum dissolution rate of 0.3 µm/s, and a minimum dissolution rate of $10^{-5}$ µm/s.

In addition, the cross-sectional observation revealed the occurrence of a film decrease.

Example 3

As an acid sensitive resin, a resin represented by the formula (3) wherein $R^3$ represents a tert-butyl group and y stands for 0.60 and having a weight-average molecular weight of 12,000 was employed.

A resist composition comprising 17 wt. % of the acid sensitive resin, 0.85 wt. % (5 wt. % of the acid sensitive resin) of N-(p-tert-butylcarboxybenzenesulfonyloxy)-5-norbornene-2,3-dicarboxyimide as a photoacid generator and 82.15 wt. % of a 1:1 mixed solvent of PGMEA and EL as a solvent was applied to a silicon substrate to form a film having a thickness of 0.70 µm. The resulting film was then exposed to light by an ArF stepper under the optical conditions of NA of 0.60 and a of 0.75, whereby a contact hole pattern of 0.2 µm was formed. As an alkali developer, a 0.12% TMAH aqueous solution was employed.

As a result of the evaluation under the utterly same conditions as those of Example 1, it was found that the composition had excellent focal depth of 0.60 µm and a maximum dissolution rate as high as 0.08 µm/s. These values are much superior to those of the ordinarily employed resist corresponding to an ArF light source. It was also found that a minimum dissolution rate was $10^{-3}$ µm/s, which was almost equal to that of the ordinarily-employed resist corresponding to an ArF light source.

Comparative Example 3

A resist composition comprising 15 wt. % of the acid sensitive resin employed in Example 3, 0.75 wt. % (5 wt. % of the acid sensitive resin) of N-(p-toluenesulfonyloxy)-5-norbornene-2,3-dicarboxyimide as a photoacid generator and 84.25 wt. % of a 1:1 mixed solvent of PGMEA and EL as a solvent was applied to a silicon substrate to form a film having a thickness of 0.70 µm. The resulting film was then exposed to light by an ArF stepper under the optical conditions of NA of 0.60 and a of 0.75, whereby a contact hole pattern of 0.20 µm was formed. As an alkali developer, a 0.12% TMAH aqueous solution was employed.

As a result of the evaluation under the utterly same conditions as those in Example 1, the composition was found to have a focal depth as shallow as 0.30 µm, a maximum dissolution rate of 0.02 µm/s, and a minimum dissolution rate of $10^{-3}$ µm/s.

Example 4

As an acid sensitive resin, employed was a crosslink-structured resin represented by the formula (5) wherein the cross-linked structure $R^6$ represents —CO—O—C(CH$_3$)$_2$—O—CO— and w stands for 0.4 and having a weight-average molecular weight of 4,000,000.

A resist composition comprising 16 wt. % of the acid sensitive resin, 0.8 wt. % (5 wt. % of the acid sensitive resin) of N-(p-toluenesulfonyloxy)-5-norbornene-2,3-dicarboxyimide as a photoacid generator and 83.2 wt. % of a 1:1 mixed solvent of PGMEA and EL as a solvent was applied to a silicon substrate to form a film having a thickness of 0.50 µm. The resulting film was then exposed to light by a KrF stepper under the optical conditions of NA of 0.60 and a of 0.75, whereby a stripe pattern having a line spacing and line width, each 0.15 µm, was formed. As an alkali developer, a 0.12% TMAH aqueous solution was employed.

As a result of the evaluation under the utterly same conditions as those of Example 1, it was found that the composition had excellent focal depth of 1.00 µm, a maximum dissolution rate of 0.02 µm/s, which was equal to that of the ordinarily employed resist corresponding to an ArF light source, and a minimum dissolution rate of $10^{-4}$ µm/s, which was smaller than that of the ordinarily-employed resist corresponding to an ArF light source. In addition, the rectangularity of the pattern was excellent.

Comparative Example 4

In a similar manner to Example 4, film formation, pattern formation and evaluation were carried out using the resist composition employed in Comparative Example 3.

As a result, the composition was found to have a focal depth as shallow as 0.50 µm, a maximum dissolution rate of 0.02 µm/s, and a minimum dissolution rate of $10^{-3}$ µm/s.

In addition, the cross-sectional observation revealed the occurrence of a film decrease.

Example 5

A resist composition comprising 17 wt. % of the acid sensitive resin employed in Example 4, 0.85 wt. % (5 wt. % of the acid sensitive resin) of N-(p-tert-butylcarboxybenzenesulfonyloxy)-5-norbornene-2,3-dicarboxyimide as a photoacid generator and 82.15 wt. % of a 1:1 mixed solvent of PGMEA and EL as a solvent was applied to a silicon substrate to form a film having a thickness of 0.50 μm. The resulting film was then exposed to light by a KrF stepper under the optical conditions of NA of 0.60 and σ of 0.75, whereby a stripe pattern having a line spacing and line width, each 0.15 μm, was formed. As an alkali developer, a 0.12% TMAH aqueous solution was employed.

As a result of the evaluation under the utterly same conditions as those of Example 1, it was found that the composition had excellent focal depth of 1.10 μm, a maximum dissolution rate of 0.08 μm/s, which was equal to that of the ordinarily employed resist corresponding to an ArF light source, and a minimum dissolution rate of $10^{-4}$ μm/s, which was smaller than that of the ordinarily-employed resist corresponding to an ArF light source. In addition, the rectangularity of the pattern was excellent.

It should be noted that in the present invention, the weight-average molecular weight is a value as measured by liquid chromatography (in terms of styrene).

What is claimed is:

1. A chemically amplified resist composition comprising:
   a photoacid generator which releases an acid upon exposure to light; and
   an acid sensitive resin which comprises an alkali soluble group protected with a dissolution controlling group and is converted into an alkali soluble resin by the cleavage of the dissolution controlling group by the action of the acid,
   wherein said photoacid generator comprises a dicarboxyimide, and
   wherein said acid comprises a sulfonic acid group and a carboxyl group and said alkali soluble resin comprises a carboxyl group.

2. A chemically amplified resist composition according to claim 1, wherein the photoacid generator comprises a compound represented by the following formula (1):

(1)

wherein $R^1$ represents a dicarboxyimide compound residue and $R^2$ represents a cyclohexylene or phenylene group.

3. A chemically amplified resist composition according to claim 2, wherein the acid sensitive resin has a weight-average molecular weight of 3,000 to 30,000

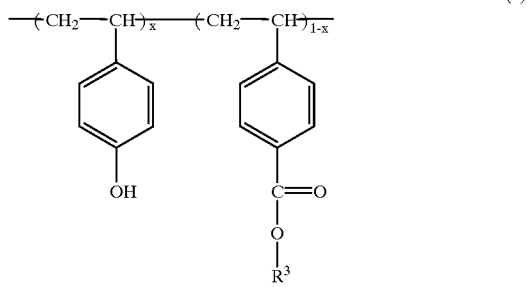

(2)

and is represented by the following formula (2) or (3):

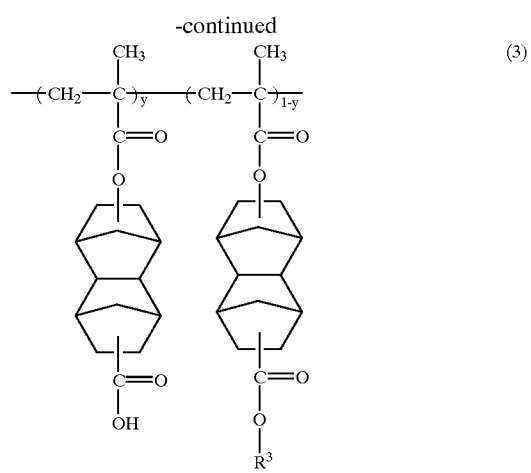

(3)

wherein $R^3$ represents a tert-butyl group, tetrahydropyranyl group or $R^4(R^5O)CH$— in which $R^4$ and $R^5$ each independently represents a $C_{1-4}$ alkyl group, x stands for 0.4 to 0.9 and y stands for 0.1 to 0.9.

4. A chemically amplified resist composition according to claim 3, wherein the photoacid generator is incorporated in an amount of 1 to 15 wt. % relative to the acid sensitive resin.

5. A chemically amplified resist composition according to claim 2, wherein the photoacid generator is incorporated in an amount of 1 to 15 wt. % relative to the acid sensitive resin.

6. A chemically amplified resist composition according to claim 1, wherein the acid sensitive resin has a weight-average molecular weight of 3,000 to 30,000 and is represented by the following formula (2) or (3):

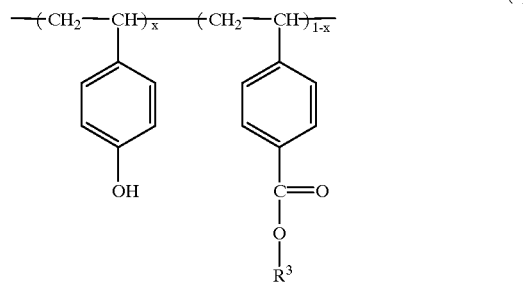

(2)

-continued

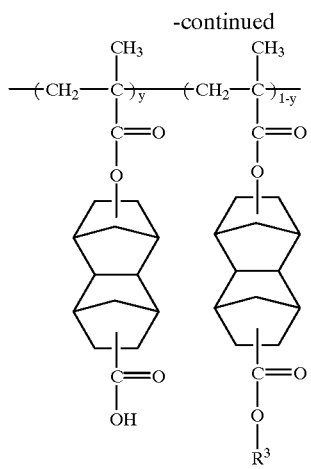

(3)

wherein $R^3$ represents a tert-butyl group, tetrahydropyranyl group or $R^4(R^5O)CH$— in which $R^4$ and $R^5$ each independently represents a $C_{1-4}$ alkyl group, x stands for 0.4 to 0.9 and y stands for 0.1 to 0.9.

7. A chemically amplified resist composition according to claim 6, wherein the photoacid generator is incorporated in an amount of 1 to 15 wt. % relative to the acid sensitive resin.

8. A chemically amplified resist composition according to claim 1, wherein the photoacid generator is incorporated in an amount of 1 to 15 wt. % relative to the acid sensitive resin.

9. A chemically amplified resist composition according to claim 1, wherein in an alkali developer, a carboxyl group in said acid associates with said carboxyl group in said alkali soluble resin, and
   wherein said alkali soluble resin acquires a sulfonic acid group improving an affinity of said alkali soluble resin to said alkali developer.

10. A chemically amplified resist composition according to claim 9, wherein when unexposed to light, said acid sensitive resin is substantially insoluble in an alkali developer.

11. A chemically amplified resist composition according to claim 9, wherein said alkali developer comprises an aqueous solution comprising tetramethoxyammonium hydroxide.

12. A chemically amplified resist composition according to claim 1, wherein said light comprises light from one of an ArF light source and a KrF light source.

13. A chemically amplified resist composition according to claim 1, wherein said dissolution controlling group comprises a tertiary-butyl group.

14. A chemically amplified resist composition according to claim 1, wherein said acid sensitive resin comprises a crosslinked-structured resin which lowers a minimum dissolution rate of said resist composition.

15. A chemically amplified resist composition according to claim 1, wherein said photoacid generator and said acid sensitive resin are dissolved in a solvent solution comprising propylene glycol monomethyl ether acetate and ethyl lactate.

16. A chemically amplified resist composition according to claim 1, wherein said photoacid generator is incorporated in an amount of 5 to 10 wt. % relative to said acid sensitive resin.

17. A chemically amplified resist composition comprising:
   a photoacid generator comprising a dicarboxyimide; and
   an acid sensitive resin comprising an alkali soluble group and a dissolution controlling group,
   wherein upon exposure to light, said photoacid generator generates an acid comprising a sulfonic acid and a carboxyl acid, and
   wherein said acid cleaves said dissolution controlling group to convert said acid sensitive resin to an alkali soluble resin comprising a carboxyl group.

18. A chemically amplified resist composition comprising:
   a photoacid generator comprising a dicarboxyimide; and
   an acid sensitive resin,
   wherein upon exposure to light, said photoacid generator generates an acid comprising a sulfonic acid and a carboxyl acid, and
   wherein said acid converts said acid sensitive resin to an alkali soluble resin.

19. A chemically amplified resist composition according to claim 18, wherein said acid sensitive resin comprises an alkali soluble group and a dissolution controlling group, and wherein
   said acid cleaves said dissolution controlling group to convert said acid sensitive resin to an alkali soluble resin.

20. A chemically amplified resist composition according to claim 19, wherein said alkali soluble resin comprises a carboxyl group.

* * * * *